(12) United States Patent
Kawadahara

(10) Patent No.: US 11,791,305 B2
(45) Date of Patent: Oct. 17, 2023

(54) MANUFACTURING APPARATUS, OPERATION METHOD THEREOF, AND METHOD FOR MANUFACTURING SEMICONDUCTOR DEVICE

(71) Applicant: Kioxia Corporation, Tokyo (JP)

(72) Inventor: Sho Kawadahara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/459,890

(22) Filed: Aug. 27, 2021

(65) Prior Publication Data

US 2022/0262764 A1    Aug. 18, 2022

(30) Foreign Application Priority Data

Feb. 18, 2021 (JP) .................. 2021-024445

(51) Int. Cl.
 *H01L 23/00* (2006.01)
 *H01L 25/065* (2023.01)
 *H01L 25/18* (2023.01)

(52) U.S. Cl.
 CPC ............ *H01L 24/799* (2013.01); *H01L 24/80* (2013.01); *H01L 24/98* (2013.01); *H01L 24/08* (2013.01); *H01L 25/0657* (2013.01); *H01L 25/18* (2013.01); *H01L 2224/08145* (2013.01); *H01L 2224/7999* (2013.01); *H01L 2224/80052* (2013.01); *H01L 2224/80908* (2013.01); *H01L 2224/80986* (2013.01); *H01L 2224/98* (2013.01)

(58) Field of Classification Search
 CPC .................. H01L 24/799; H01L 24/98; H01L 2224/80052; H01L 2224/7999; H01L 21/2007; H01L 21/67057; H01L 21/67017; H01L 22/22
 See application file for complete search history.

(56) References Cited

U.S. PATENT DOCUMENTS

| | | | |
|---|---|---|---|
| 9,882,007 B2 * | 1/2018 | Diduck | ............ H01L 24/29 |
| 9,914,233 B2 | 3/2018 | Landru | |
| 10,332,777 B2 | 6/2019 | Sekiya | |
| 10,892,269 B2 | 1/2021 | Fukuzumi et al. | |
| 11,232,959 B2 * | 1/2022 | Honda | ......... H01L 21/67173 |
| 2014/0302995 A1 * | 10/2014 | Malshe | ............ H01L 23/373 |
| | | | 156/64 |
| 2018/0082899 A1 * | 3/2018 | Klemp | ............ H01L 21/6835 |
| 2019/0273090 A1 | 9/2019 | Fukuzumi et al. | |

FOREIGN PATENT DOCUMENTS

| | | | | |
|---|---|---|---|---|
| JP | 2007131820 A | * | 5/2007 | ............ H01L 24/98 |
| JP | 2010-062901 A | | 3/2010 | |
| JP | 2012-126798 | | 7/2012 | |
| JP | 5080200 | | 11/2012 | |
| JP | 2015-534723 | | 12/2015 | |
| JP | 6016569 | | 10/2016 | |
| JP | 2018-190938 | | 11/2018 | |

* cited by examiner

*Primary Examiner* — David A Zarneke
(74) *Attorney, Agent, or Firm* — Foley & Lardner LLP

(57) ABSTRACT

According to one embodiment, a manufacturing apparatus includes: a storage configured to store a work; a transfer arm configured to transfer the work; a hot bath configured to store a liquid; a mounting table configured to mount the work in the hot bath; and an upper arm configured to apply pressure to the work mounted on the mounting table.

11 Claims, 14 Drawing Sheets

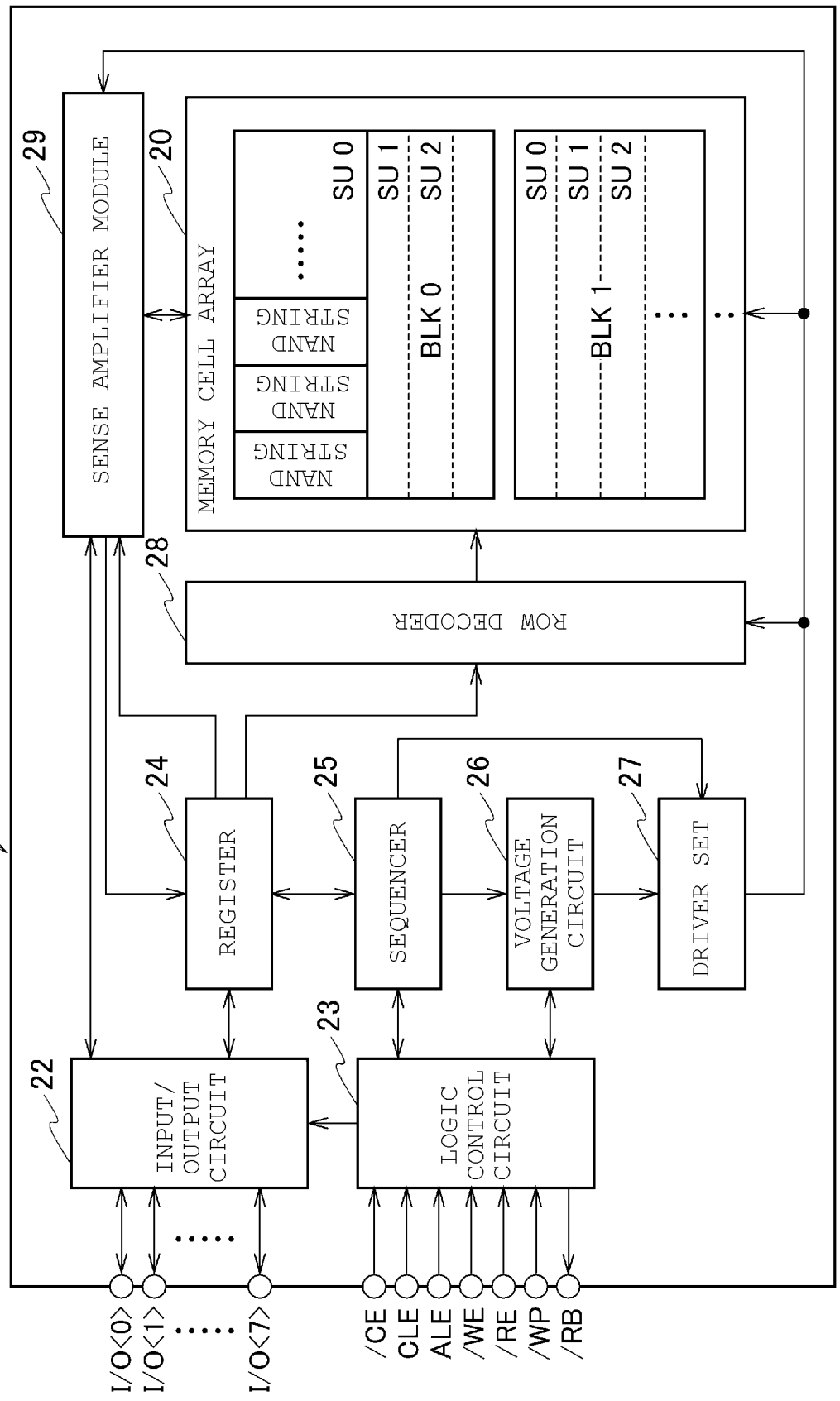

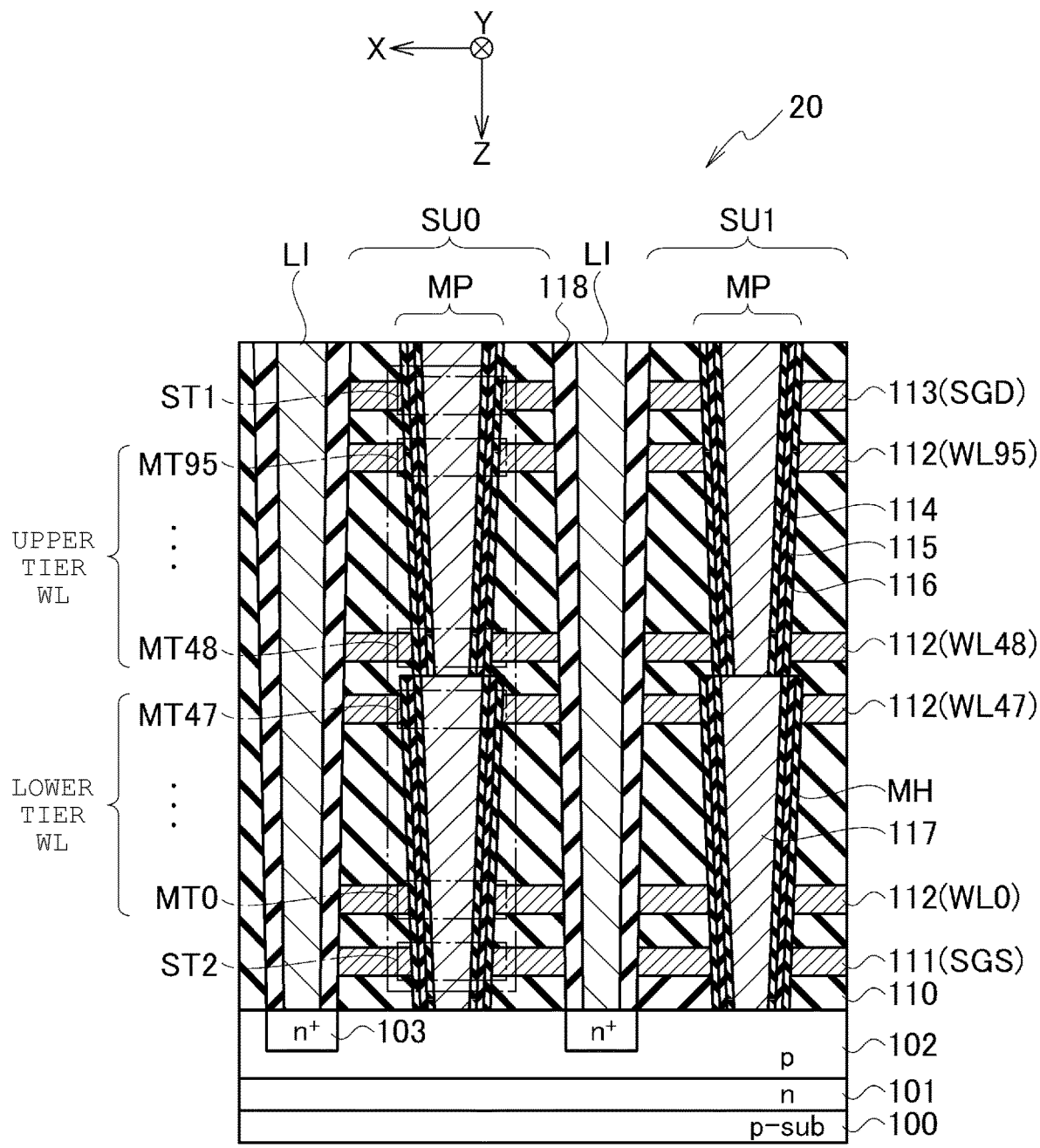

MANUFACTURING APPARATUS, OPERATION METHOD THEREOF, AND METHOD FOR MANUFACTURING SEMICONDUCTOR DEVICE

CROSS-REFERENCE TO RELATED APPLICATION

This application is based upon and claims the benefit of priority from Japanese Patent Application No. 2021-024445, filed Feb. 18, 2021, the entire contents of which are incorporated herein by reference.

FIELD

Embodiments described herein relate generally to a manufacturing apparatus, an operation method thereof, and a method for manufacturing a semiconductor device.

BACKGROUND

A memory device having a three-dimensional structure has been proposed. In addition, in order to reduce a chip occupancy rate of a control circuit of a three-dimensional memory cell array, a chip bonding array (CBA) technique has been proposed as a method of providing the control circuit directly under the three-dimensional memory cell array. The control circuit is generally configured with a complementary metal oxide semiconductor (CMOS) circuit. In the CBA technique, a CMOS chip and a memory cell array chip are produced on separate wafers and adhered (bonded) with pad electrodes. For this reason, a significant reduction in chip size can be achieved. In order to peel off the two bonded wafers, a method of mechanically peeling off the wafers has been employed.

DESCRIPTION OF THE DRAWINGS

FIG. 18 is a block diagram of the semiconductor device according to the embodiment.
FIG. 20 is a diagram illustrating an example of a cross-sectional structure of the memory cell array of the semiconductor device according to the embodiment.

DETAILED DESCRIPTION

Figure 1:
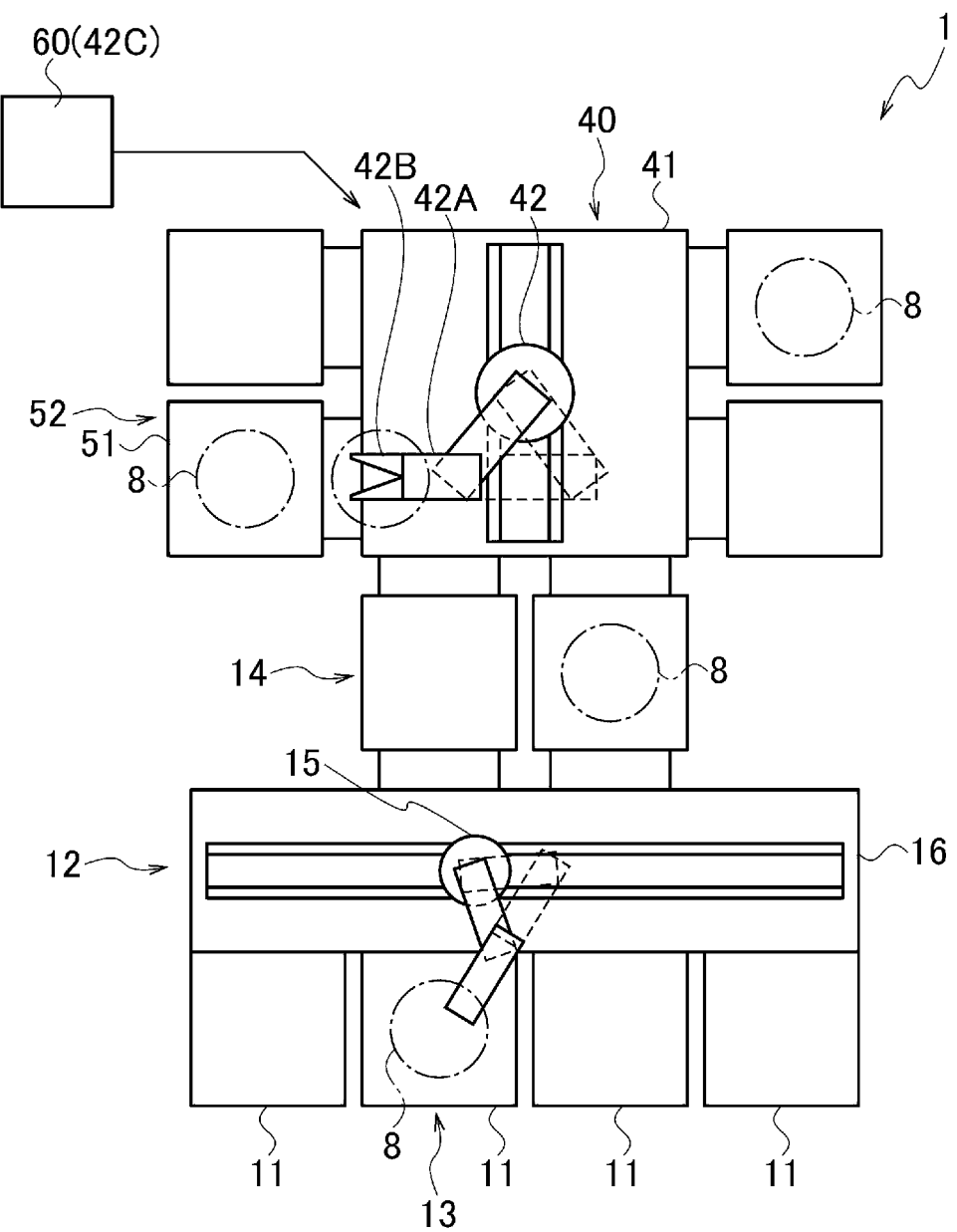
FIG. 1 is a plan view of a manufacturing apparatus according to an embodiment.

Embodiments provide a manufacturing apparatus capable of peeling off bonded wafers from each other with almost no mechanical load, an operation method thereof, and a method for manufacturing a semiconductor device.

In general, according to one embodiment, a manufacturing apparatus includes: a storage configured to store a work; a transfer arm configured to transfer the work; a hot bath configured to store a liquid; a mounting table configured to mount the work in the hot bath; and an upper arm configured to apply pressure to the work mounted on the mounting table.

Next, embodiments will be described with reference to the drawings. In the specification or drawings described below, similar components are denoted by the same reference numerals, and description thereof will be omitted. The drawings are schematic. In addition, the embodiments illustrated below exemplify apparatuses and methods for embodying the technical idea. The embodiments may be modified in various manner within the scope of the claims.

(Manufacturing Apparatus)

FIG. 1 is a plan view of a manufacturing apparatus 1 according to the embodiment. In the following, as an example, a case where the manufacturing apparatus 1 according to the present embodiment is a semiconductor device manufacturing apparatus will be illustrated. In this case, a work 8 is, for example, a bonded wafer in which two or more semiconductor wafers are bonded. As illustrated in FIG. 1, the manufacturing apparatus 1 includes an integration unit 13, a carrying unit 12, a load lock unit 14, a delivery unit 40, a processing unit 52, and a control unit 60. The integration unit 13 is provided with storage units 11.

The number of storage units 11 is not particularly limited, but productivity can be improved by providing a plurality of the storage units 11. In addition, when the plurality of storage units 11 are provided, the storage units 11 having the same configuration may be provided, or the storage units 11 having different configurations may be provided.

For example, a carrier capable of storing the works 8 in a stacked shape (multi-stage shape) may be used as the storage unit 11. For example, the storage unit 11 can be a front-opening unified pod (FOUP) or the like, which is a front-opening type carrier for carrying and storing a substrate used in a mini-environment type semiconductor factory. However, the storage unit 11 is not limited to FOUP and may be any one that can store the work 8.

In addition, the storage unit 11 is, for example, a storage unit for the work 8 in which the upper wafer and the lower wafer are bonded together. In addition, the storage unit 11 may be a storage unit for each of the upper wafer and the lower wafer which are separated from each other. The carrying unit 12 is provided between the integration unit 13 and the load lock unit 14. The carrying unit 12 carries the work 8 stored in the storage unit 11 to the load lock unit 14. The carrying unit 12 is provided with a casing 16 and a transfer unit 15.

The casing 16 has a box shape, and the transfer unit 15 is provided inside the casing 16. The casing 16 may have, for example, an airtight structure to the extent that particles and the like cannot enter from the outside. The transfer unit 15 carries and delivers the work 8 between the integration unit 13 and the load lock unit 14. The transfer unit 15 is, for example, a carrying robot having an arm that revolves around a revolving axis. The load lock unit 14 is provided between the carrying unit 12 and the delivery unit 40. The load lock unit 14 allows the work 8 to be delivered between the carrying unit 12 side and the delivery unit 40 side.

The delivery unit 40 is provided between the processing unit 52 and the load lock unit 14. The delivery unit 40 delivers the work 8 between the processing unit 52 and the load lock unit 14. The delivery unit 40 is provided with a casing 41 and a transfer unit 42. The casing 41 has a box shape, and the inside of the casing 41 is connected to the inside of the load lock unit 14 via an opening/closing door. The transfer unit 42 is provided inside the casing 41. The transfer unit 42 is provided with an arm 42A, a support unit 42B, and a control unit 42C. The arm 42A is, for example, an articulated arm. The support unit 42B is provided at a tip end of the arm 42A and supports the work 8.

The transfer unit 42 delivers the works 8 between the load lock unit 14 and a chamber 51 by supporting the works 8 by the support unit 42B, changing the direction of the arm 42A, and expanding and contracting the arm 42A so as to be bent. The transfer unit 42 is, for example, a carrying robot having an arm 42A that revolves around a revolving axis. For example, the control unit 42C that controls the operation of the transfer unit 42 may be provided in the control unit 60. The processing unit 52 performs a desired processing on the works 8 mounted inside the chamber 51. The processing unit 52 performs the peeling process by, for example, heating the works 8 in a hot bath for a specified time.

In addition, the number of processing units 52 is not particularly limited. When the plurality of processing units 52 are provided, the processing unit 52 may perform the same type of processing or may perform different types of processing. In addition, when the same type of processing is performed, the processing conditions may be different from each other, or the processing conditions may be the same. The control unit 60 controls the operation of each element provided in the manufacturing apparatus 1.

The control unit 60 controls operations of elements such as delivering the works 8 by the transfer unit 42, controlling of an internal pressure in the load lock unit 14 and the casing 41, delivering the works 8 by the transfer unit 15, and various processes by the processing unit 52.

Herein, the works 8 are carried into the chamber 51 one by one. At this time, the transfer unit 42 positions the works 8 so that the center of the work 8 overlaps the center of the chamber 51 (the center of the mounting unit 5).

When the processing is performed in a state where the center of the work 8 is deviated from the center of the chamber 51 (the center of the mounting unit 5), there is a concern that an increase in variation in the outer peripheral portion of the work during the peeling off the work 8, deterioration of the yield on the outer peripheral portion of the work, and the like may occur. For this reason, it is important to accurately position the center of the work 8 with respect to the center of the chamber 51 (the center of the mounting unit 5). In this case, a sensor may be disposed on a carrying path of the work 8, the amount of misalignment of the work 8 can be detected during carrying, and the position can be corrected during carrying of the work 8.

In addition, a unit which detects the amount of misalignment of the work 8 is disposed on the carrying path, the amount of misalignment of the work 8 is detected by the unit, and the work 8 can also be carried by correcting a movement command amount by the amount of misalignment with respect to the center of the chamber 51 (the center of the mounting unit 5).

(Operation Method of Manufacturing Apparatus)

In the CBA technique, in some cases, a process of peeling off two bonded wafers may be required in the manufacturing process. The manufacturing apparatus according to the embodiment may be used as a method of peeling off the two bonded wafers.

Figure 2:
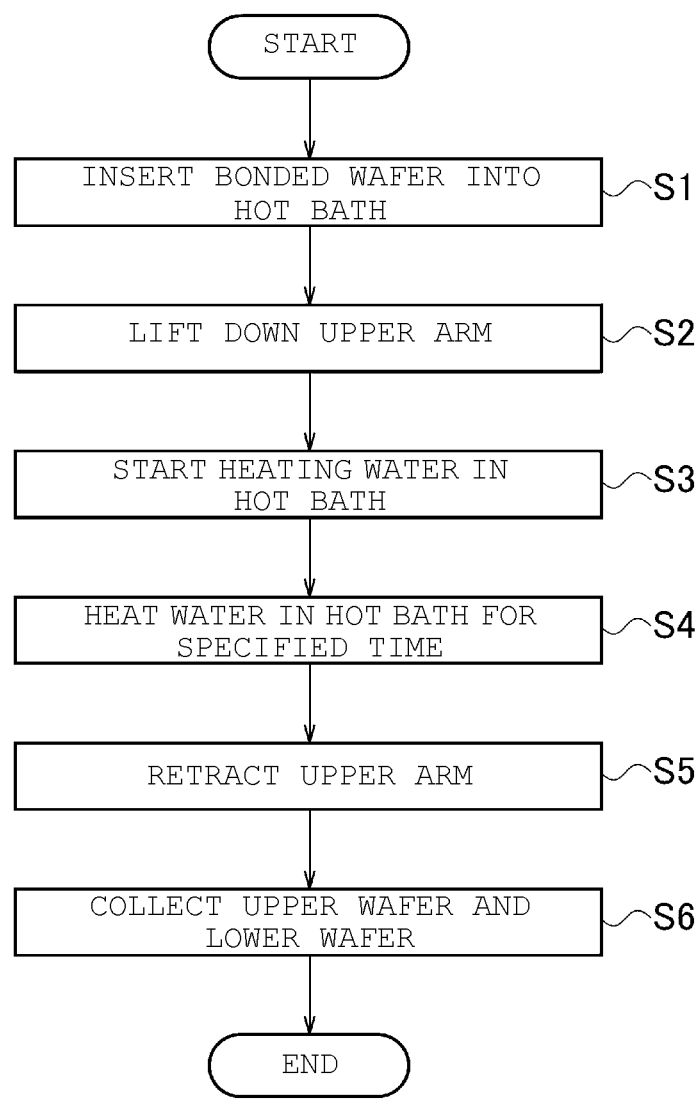
FIG. 2 is a flowchart of an operation method of the manufacturing apparatus according to the embodiment.

FIG. 2 is a flowchart of an operation method of the manufacturing apparatus according to the embodiment. The detailed operation method will be described later with reference to the cross-sectional views of FIGS. 3 to 10. First, the operation flow of the manufacturing apparatus will be described.

(A) First, the works 8 stored in the storage unit 11 in step S1 is transferred to the load lock unit 14 by the transfer unit 15. Next, the transfer unit 42 inserts the works 8 mounted on the load lock unit 14 into a hot bath 4 (FIGS. 3A and 3B) in the chamber 51 of the processing unit 52.

(B) Next, in step S2, the upper arm 7 (FIG. 7) is lifted down to apply pressure to the works 8.

(C) Next, in step S3, heating of the water in the hot bath 4 is started.

(D) Next, in step S4, the water in the hot bath 4 is heated at a boiling point or more for a specified time.

(E) Next, in step S5, the upper arm 7 is retracted from an upper wafer 2U of the work 8.

(F) Next, in step S6, the upper wafer 2U and a lower wafer 2D separated from each other are collected. In the collection, the procedure opposite to that in step S1 is executed. First, the upper wafer 2U in the chamber 51 of the processing unit 52 is transferred to the load lock unit 14 by the transfer unit 42. Next, the upper wafer 2U mounted on the load lock unit 14 by the transfer unit 15 is stored in the storage unit 11 which stores the upper wafer 2U. Similarly, the lower wafer 2D in the chamber 51 of the processing unit 52 is transferred to the load lock unit 14 by the transfer unit 42. Next, the lower wafer 2D mounted on the load lock unit 14 by the transfer unit 15 is stored in the storage unit 11 which stores the lower wafer 2D.

(Boil Rework Apparatus)

Figure 3A:
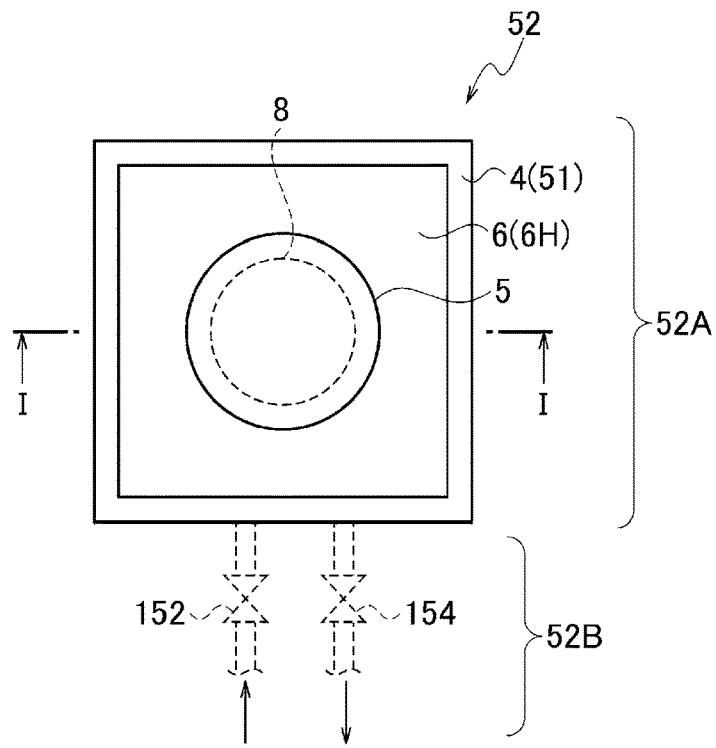
FIG. 3A is a plan view of a processing unit of the manufacturing apparatus according to the embodiment.
Figure 3B:
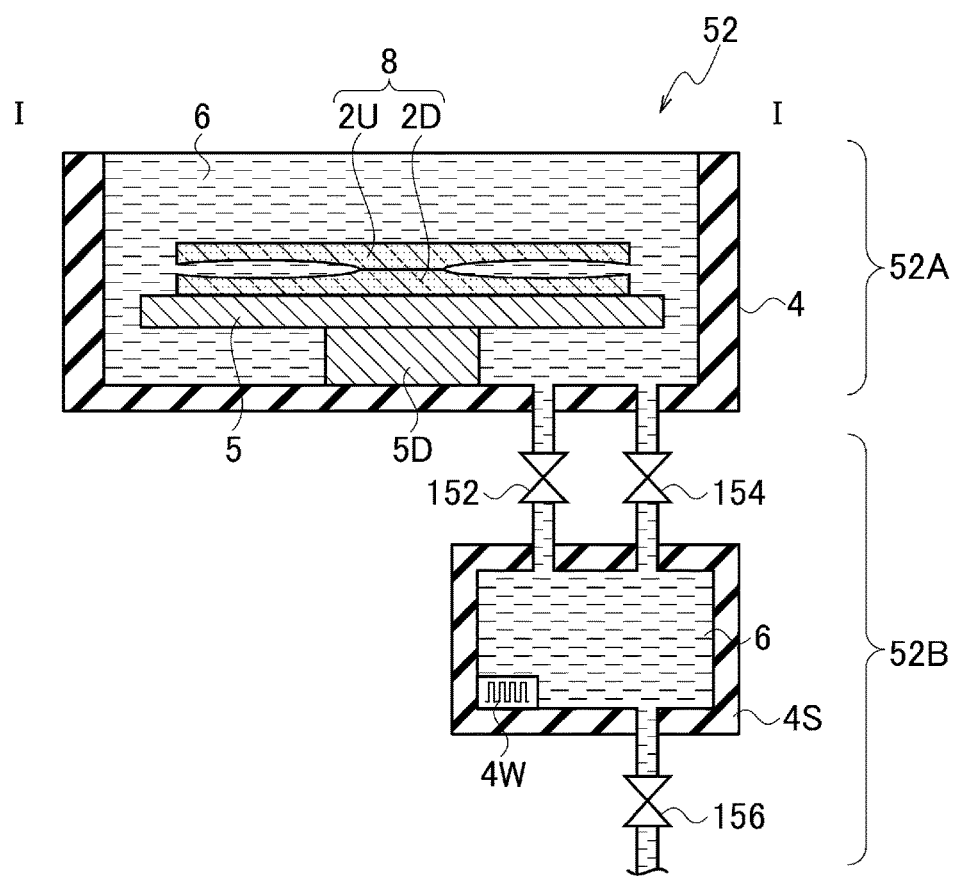
FIG. 3B is a cross-sectional view of a processing unit and a view illustrating a first process of the operation method of the manufacturing apparatus according to the embodiment.

FIG. 3A is a plan view of the processing unit 52 of the manufacturing apparatus 1 according to the embodiment. In addition, FIG. 3B is a cross-sectional view of the processing unit 52 of the manufacturing apparatus 1 according to the embodiment. FIG. 3B is a cross-sectional view taken along the line I-I of FIG. 3A. FIG. 3B illustrates a state in which the hot bath 4 is filled with water 6.

The processing unit 52 illustrated in FIGS. 3A and 3B configures a boil rework apparatus. The boil rework apparatus is a manufacturing apparatus which peels off the upper wafer 2U and the lower wafer 2D by mounting the work 8 in the hot bath 4 and performing a boiling process. As illustrated in FIGS. 3A and 3B, the processing unit 52 includes a peeling processing unit 52A and a water supply/discharge unit 52B. The peeling processing unit 52A is connected to the water supply/discharge unit 52B. The peeling processing unit 52A is provided with a chamber 51 and a mounting unit 5 for the work 8. The chamber 51 includes the hot bath 4 inside. The mounting unit 5 is provided inside the chamber 51. The center of the mounting unit 5 in a plan view overlaps the center of the chamber 51. The mounting unit 5 is concentric with the chamber 51. The work 8 is mounted on the upper surface of the mounting unit 5. In addition, the mounting unit 5 is provided with an electrostatic chuck 5D. The work 8 mounted on the upper surface of the mounting unit 5 is held by the electrostatic chuck 5D. The water supply/discharge unit 52B is provided with a water supply/discharge tank 4S and valves 152, 154, and 156. The water (6H) can be supplied and discharged from the water supply/discharge unit 52B to the hot bath 4 via the valves 152 and 154. The water 6 can be supplied/discharged to the water supply/discharge tank 4S from the outside by opening and closing the valve 156. The water supply/discharge tank 4S is provided with a heater unit 4W for heating water. The water 6 in the water supply/discharge tank 4S is supplied into the hot bath 4. The water 6 in the water supply/discharge tank 4S can be heated by the heater unit 4W.

(Operation Method of Manufacturing Apparatus According to Embodiment)

Figure 4:
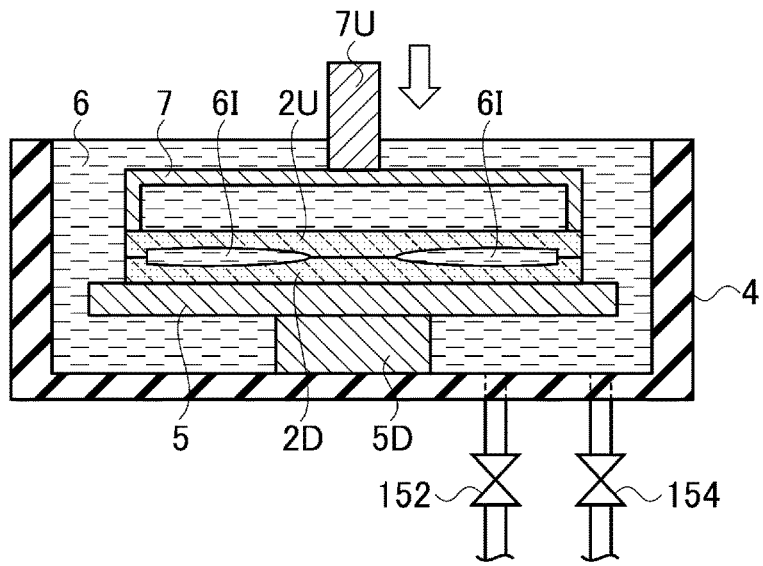
FIG. 4 is a view illustrating a second process of the operation method of the manufacturing apparatus according to the embodiment.
Figure 5:
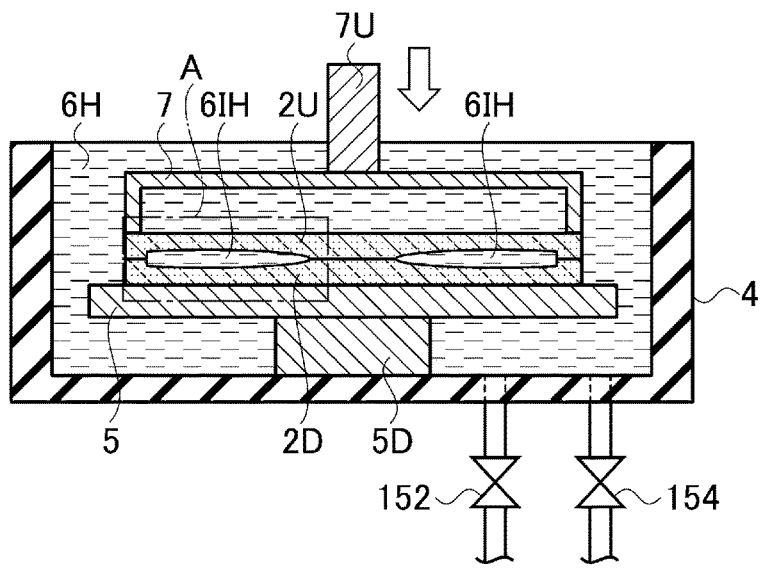
FIG. 5 is a view illustrating a third process of the operation method of the manufacturing apparatus according to the embodiment.

FIG. 3B is a diagram illustrating a first process of an operation method of the manufacturing apparatus 1 according to the embodiment. FIG. 4 is a diagram illustrating a second process of the operation method of the manufacturing apparatus 1 according to the embodiment. FIG. 5 is a diagram illustrating a third process of the operation method of the manufacturing apparatus 1 according to the embodiment.

(A) First, as illustrated in FIG. 3B, the work 8 is disposed in the mounting unit 5 in the hot bath 4. Herein, as illustrated in FIG. 3B, the work 8 is a bonded wafer of the upper wafer 2U and the lower wafer 2D.

(B) Next, in the processing unit 52, the valve 154 is closed, the valve 152 and the valve 156 are opened, and the water 6 is supplied from the outside, so that the water is stored in the water supply/discharge tank 4S and the hot bath 4.

(C) Next, when a predetermined amount of the water 6 is stored in the water supply/discharge tank 4S and the hot bath 4, the valve 156 is closed, and the heater unit 4W starts heating the water 6.

(D) Next, as illustrated in FIG. 4, the upper arm 7 and an upper arm support portion 7U are lifted down to press the outer peripheral portions of the upper wafer 2U and the lower wafer 2D against the upper wafer 2U of the work 8 to come the upper wafer 2U and the lower wafer 2D into close contact with each other.

(E) Next, as illustrated in FIG. 5, the heater unit 4W heats the water 6H in the hot bath 4 at a boiling point or more for a specified time. At this time, the pressurizing the outer peripheral portions of the upper wafer 2U and the lower wafer 2D is maintained.

Figure 6:
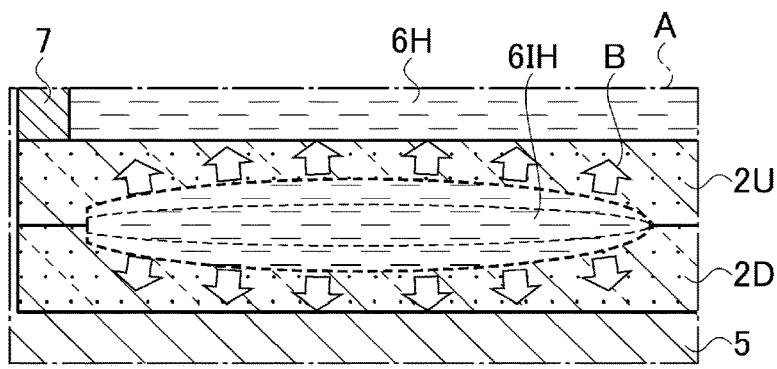
FIG. 6 is an enlarged view of a broken line A portion in FIG. 5, and is a view illustrating a wafer peeling process.

FIG. 6 is an enlarged view of a broken line A portion in FIG. 5, and is a view illustrating a wafer peeling process. As illustrated in FIG. 6, the water 61H entering the gap between the upper wafer 2U and the lower wafer 2D is also heated at the boiling point or more for a specified time to be converted into a water vapor. Herein, due to the volume expansion of the water vapor gas, a force is exerted in the direction of peeling off the upper wafer 2U and the lower wafer 2D as illustrated by an arrow B. By impregnating non-adhered gaps with a liquid and utilizing thermal expansion due to the heating the liquid at a boiling point or more, it is possible to peel off adhered wafers between semiconductor wafers while reducing damage as much as possible.

It is desirable that the liquid is a liquid that has a boiling point equal to or lower than the temperature at which the wafer substrates are adhered to each other. For this reason, for example, pure water is used. In addition, a low temperature liquid such as liquid nitrogen may be applied.

The bonded wafer as a reworking target has gaps which are non-adhered sites, and the inside of the work 8 is filled with a solvent by impregnating the wafer in the hot bath 4. After the upper arm 7 is lifted down to hermetically seal the outer peripheral portion of the work, by heating the liquid, the solvent entering the inside of the work is vaporized. The vaporized gas expands inside the work, but since the outer peripheral portion of the work, which is a gas escape route, is already hermetically sealed, the gas further expands inside, so that the wafers of the work can be peeled off. It is possible to peel off the adhered wafer between wafers while reducing damage.

(F) Next, the upper arm 7 and the upper arm support portion 7U are retracted from the work 8.

(G) When the wafer peeling process is completed, the valve 152 is closed, the valve 154 and the valve 156 are opened, and the water 6H in the hot bath 4 and the water supply/discharge tank 4S is discharged to the outside.

(H) Next, the upper wafer 2U and the lower wafer 2D peeled off from each other are collected.

(Operation Method of Manufacturing Apparatus According to Modification of Embodiment)

Figure 7:
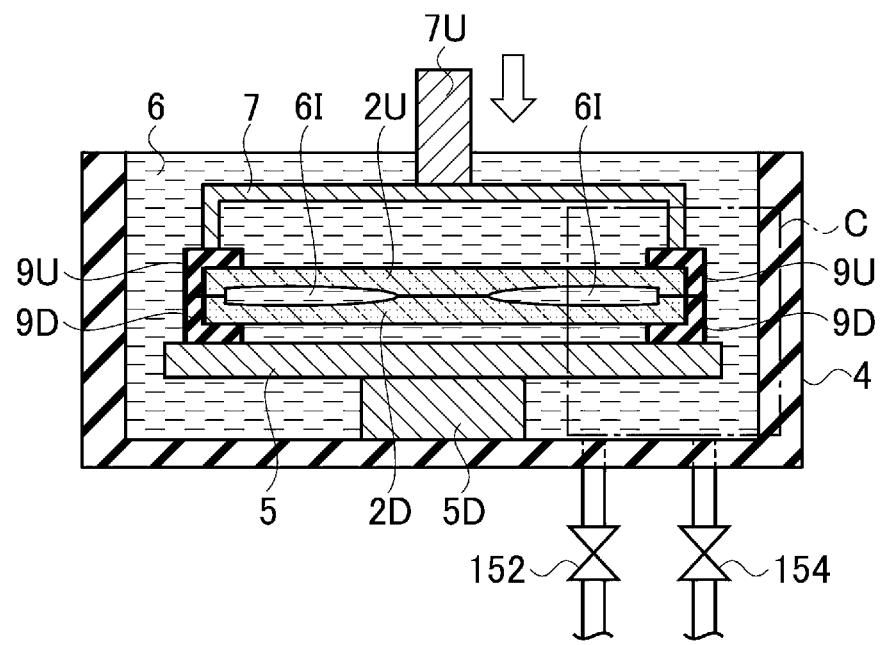
FIG. 7 is a cross-sectional view of a processing unit of a manufacturing apparatus according to a modification of the embodiment and a view illustrating one process of an operation method thereof.
Figure 8:
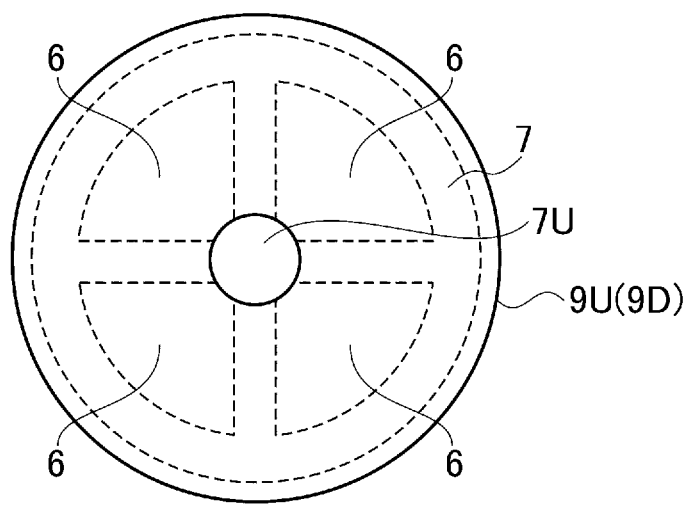
FIG. 8 is a plan view of an upper arm of a manufacturing apparatus according to a modification of the embodiment.
Figure 9:
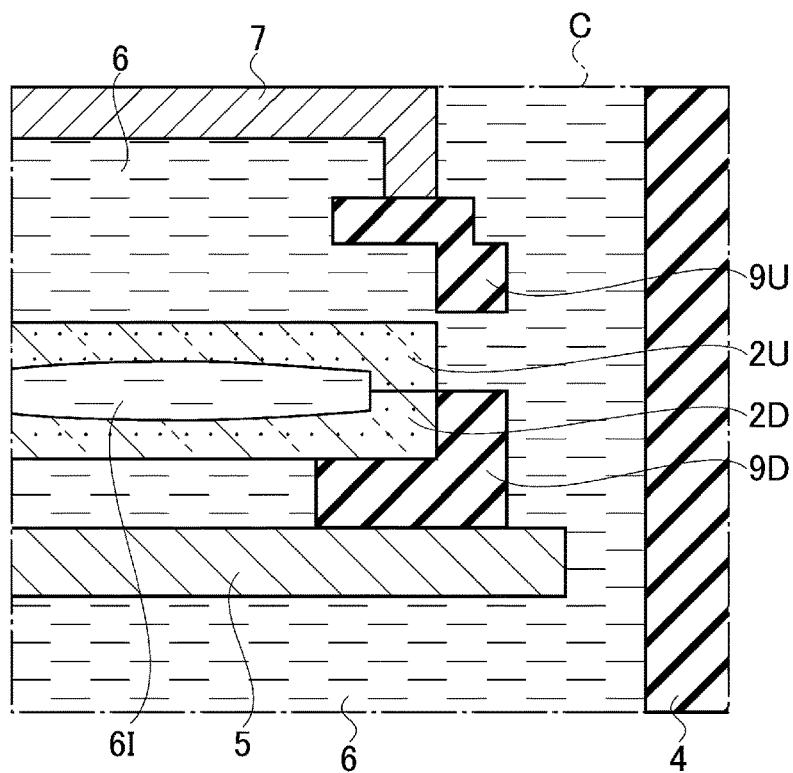
FIG. 9 is an enlarged view of a broken line C portion before pressurization in FIG. 7.
Figure 10:
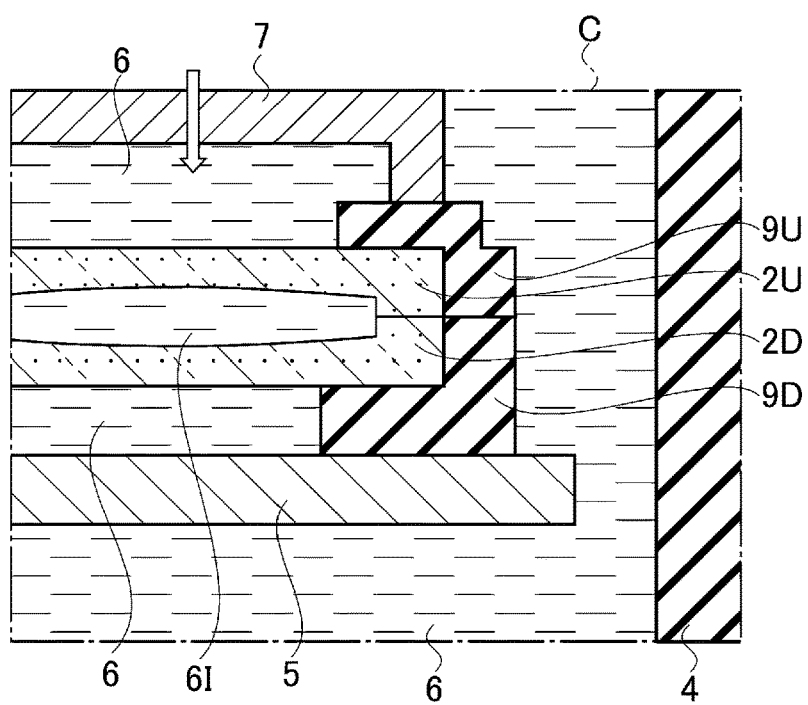
FIG. 10 is an enlarged view of a broken line C portion after pressurization in FIG. 7.

FIG. 7 is a diagram illustrating an operation method of the manufacturing apparatus according to a modification of the embodiment. FIG. 8 is a plan view of an upper arm of the manufacturing apparatus according to the modification of the embodiment. As illustrated in FIG. 7, the manufacturing apparatus according to the modification of the embodiment includes a first insulating portion 9U and a second insulating portion 9D. The second insulating portion 9D is disposed on the mounting unit 5. On the other hand, the first insulating portion 9U is disposed at a tip end portion of the upper arm 7. As illustrated in FIGS. 7 and 8, by using the donut-shaped first insulating portion 9U and the second insulating portion 9D, only the outer peripheral portions of the wafers can be hermetically sealed. FIG. 9 is an enlarged view of the broken line C portion before pressurization in FIG. 7. FIG. 10 is an enlarged view of the broken line C portion after pressurization in FIG. 7.

The manufacturing apparatus according to the modification of the embodiment includes the first insulating portion 9U disposed on the outer peripheral portion of the upper arm 7 in contact with the work 8 and the second insulating portion 9D disposed on the outer peripheral portion of the mounting unit 5 in contact with the work 8. By pressurizing the upper arm 7, the first insulating portion 9U and the second insulating portion 9D can be brought into close contact with each other.

The first insulating portion 9U and the second insulating portion 9D are configured with a flexible donut-shaped resin layer formed of a silicon rubber or the like. Since the adhesion between the first insulating portion 9U and the second insulating portion 9D is good, it is possible to prevent the gas generated inside the work from escaping to the outside. As a result, the bonded wafer can be peeled off by utilizing the gas expansion.

(Method for Manufacturing Semiconductor Device)

Figure 11:
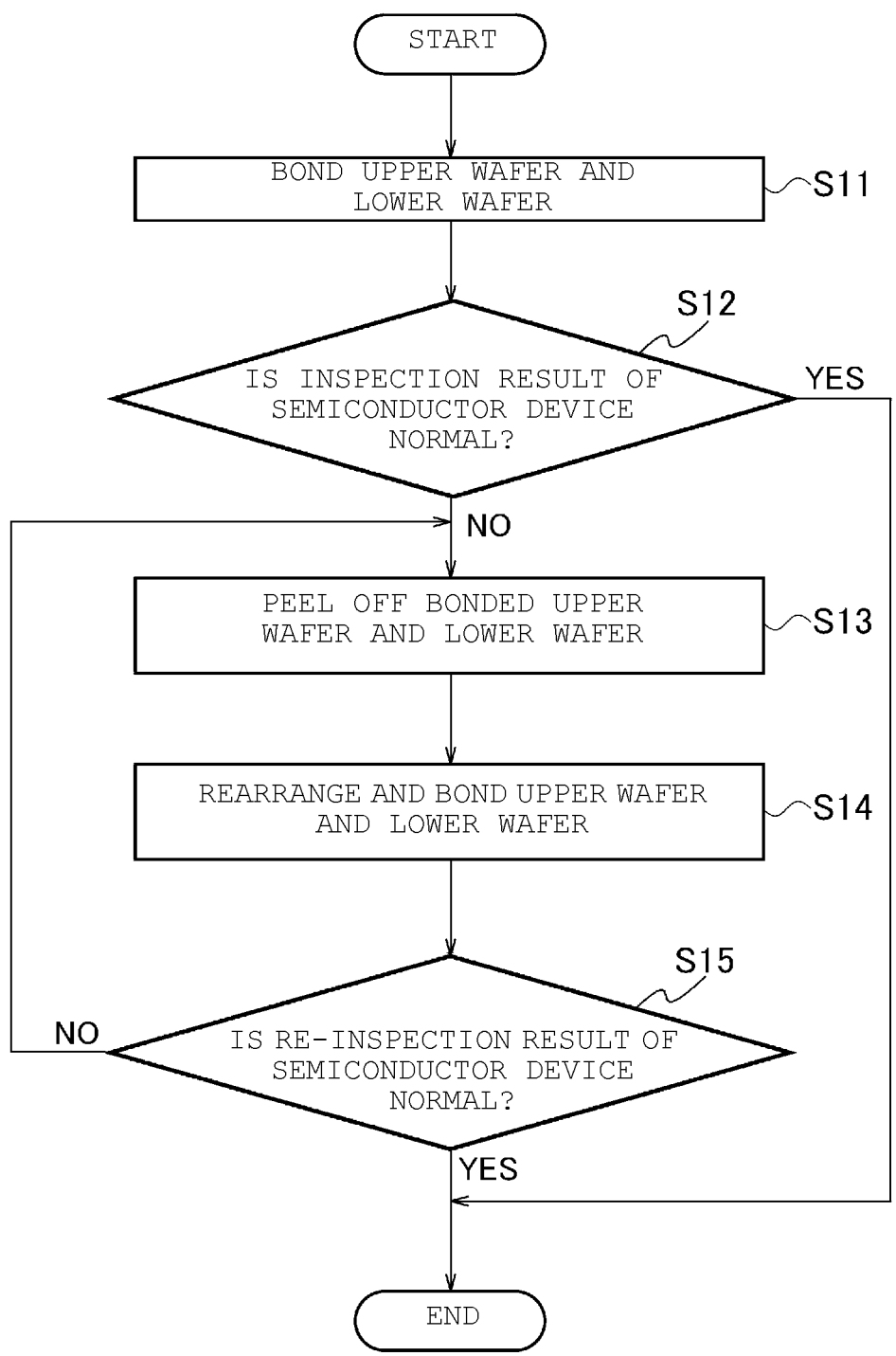
FIG. 11 is a flowchart of a method for manufacturing a semiconductor device according to an embodiment.

Hereinafter, a method for manufacturing a semiconductor device according to the embodiment will be described. In the method for manufacturing a semiconductor device according to the embodiment, the manufacturing apparatus according to the embodiment or a modification thereof can be applied. In addition, as the semiconductor device, a semiconductor storage device 30 will be described as an example. FIG. 11 is a flowchart of a method for manufacturing a semiconductor device according to the embodiment.

(A) First, in step S11, the upper wafer and the lower wafer are bonded together. Herein, the upper wafer corresponds to a memory cell array chip 20, and the lower wafer corresponds to a CMOS chip 10.

(B) Next, in step S12, it is determined whether or not the inspection result of the bonded semiconductor device is normal. If NO, the process proceeds to step S13. If YES, the process ends.

(C) In step S13, the upper wafer and the lower wafer of the bonded semiconductor device are peeled off. Herein, in the peeling process, the manufacturing apparatus and the operation method thereof according to the embodiment or its modification are applied.

(D) Next, in step S14, the peeled upper wafer and lower wafer are redisposed and bonded.

(E) Next, in step S15, it is determined whether or not a re-inspection result of the bonded semiconductor device is normal. If NO, the process proceeds to step S13. If YES, the process ends.

(Structural Example of Semiconductor Device)

(First Structural Example)

Figure 12:
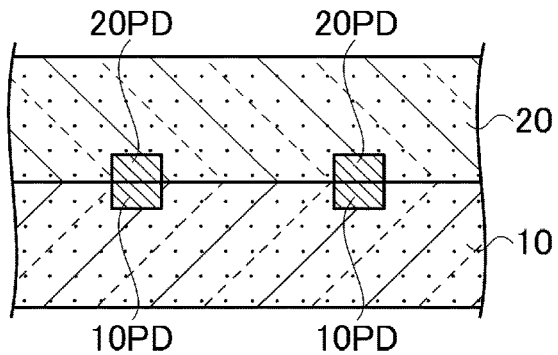
FIG. 12 is a cross-sectional view of a first structural example of the semiconductor device according to the embodiment.

FIG. 12 is a cross-sectional view of a first structural example of the semiconductor device according to the embodiment. In FIG. 12, the lower wafer corresponds to the CMOS chip 10, and the upper wafer corresponds to the memory cell array chip 20. A pad electrode 10PD is disposed on a bonding surface of the CMOS chip 10, and a pad electrode 20PD is disposed on a bonding surface of the memory cell array chip 20. The CMOS chip 10 and the memory cell array chip 20 are produced in separate wafers and are adhered (bonded) to the pad electrode 10PD and the pad electrode 20PD by CBA technique.

(Second Structural Example)

Figure 13:
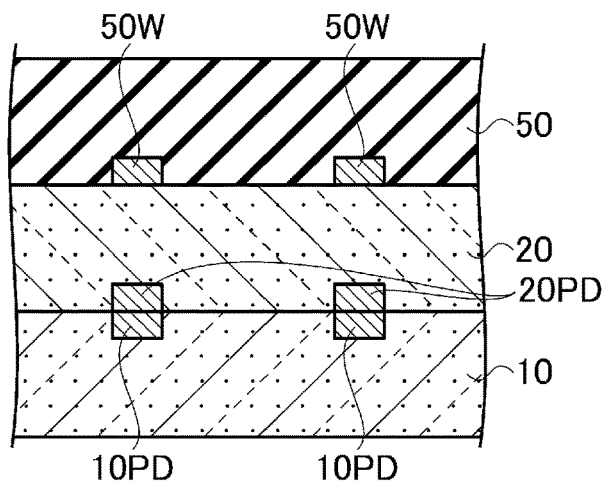
FIG. 13 is a cross-sectional view of a second structural example of the semiconductor device according to the embodiment.

FIG. 13 is a cross-sectional view of a second structural example of the semiconductor device according to the embodiment. In FIG. 13, the lower wafer corresponds to the CMOS chip 10, and the upper wafer corresponds to the memory cell array chip 20. In addition, a wiring portion 50 is disposed on the upper wafer. The wiring portion 50 may be formed of an insulating substrate or a high-resistance semiconductor wafer. The pad electrode 10PD is disposed on the bonding surface of the CMOS chip 10, and the pad electrode 20PD is disposed on the bonding surface of the memory cell array chip 20. A wiring layer 50W is disposed in the wiring portion 50. The CMOS chip 10 and the memory cell array chip 20 are produced in separate wafers and are adhered (bonded) to the pad electrode 10PD and the pad electrode 20PD by CBA technique.

(Third Structural Example)

Figure 14:
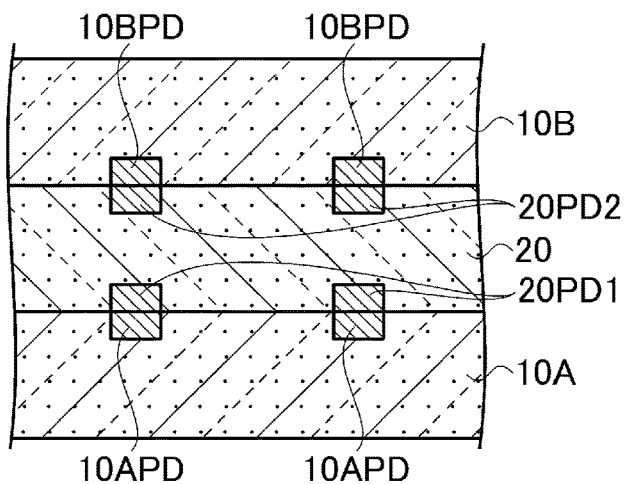
FIG. 14 is a cross-sectional view of a third structural example of the semiconductor device according to the embodiment.

FIG. 14 is a cross-sectional view of a third structural example of the semiconductor device according to the embodiment. In FIG. 14, the lower wafer corresponds to a CMOS chip 10A, and the upper wafer corresponds to the memory cell array chip 20. In addition, a CMOS chip 10B is disposed on the upper wafer. A pad electrode 10APD is disposed on the first bonding surface of the CMOS chip 10A, and a pad electrode 20PD1 is disposed on the first bonding surface of the memory cell array chip 20. A pad electrode 10BPD is disposed on the second bonding surface of the CMOS chip 10B, and a pad electrode 20PD2 is disposed on the second bonding surface of the memory cell array chip 20. The CMOS chips 10A and 10B and the memory cell array chip 20 are produced in separate wafers, are adhered (bonded) to the pad electrode 10APD and the pad electrode 20PD1, and adhered (bonded) to the pad electrode 10BPD and the pad electrode 20PD2 by CBA technique.

(Fourth Structural Example)

Figure 15:
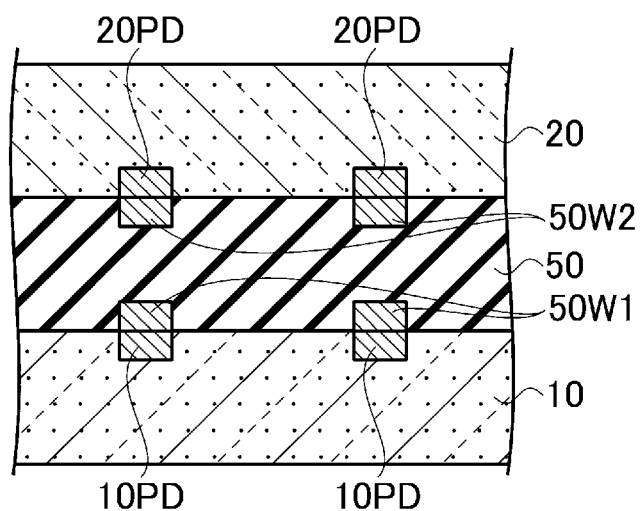
FIG. 15 is a cross-sectional view of a fourth structural example of the semiconductor device according to the embodiment.

FIG. 15 is a cross-sectional view of a fourth structural example of the semiconductor device according to the embodiment. In FIG. 15, the lower wafer corresponds to the CMOS chip 10, and the upper wafer corresponds to the memory cell array chip 20. In addition, the wiring portion 50 is disposed between the lower wafer and the upper wafer. The pad electrode 10PD is disposed on the first bonding surface of the CMOS chip 10, and a wiring layer 50W1 is disposed on the first bonding surface of the wiring portion 50. A wiring layer 50W2 is disposed on the second bonding surface of the wiring portion 50, and the pad electrode 20PD is disposed on the second bonding surface of the memory cell array chip 20. The CMOS chip 10 and the memory cell array chip 20 are produced in separate wafers, are adhered (bonded) to the pad electrode 10PD and the wiring layer 50W1, and are adhered (bonded) to the pad electrode 20PD and the wiring layer 50W2 by CBA technique.

(Fifth Structural Example)

Figure 16:
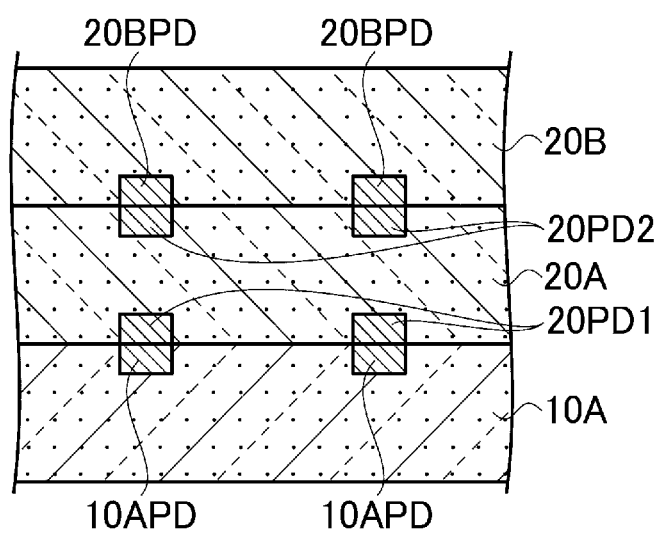
FIG. 16 is a cross-sectional view of a fifth structural example of the semiconductor device according to the embodiment.

FIG. 16 is a cross-sectional view of a fifth structural example of the semiconductor device according to the embodiment. In FIG. 16, the lower wafer corresponds to the CMOS chip 10A, and the upper wafer corresponds to a memory cell array chip 20A. In addition, a memory cell array chip 20B is disposed on the upper wafer. The pad electrode 10APD is disposed on the first bonding surface of the CMOS chip 10A, and the pad electrode 20PD1 is disposed on the first bonding surface of the memory cell array chip 20A. The pad electrode 20PD2 is disposed on the second bonding surface of the memory cell array chip 20A, and the pad electrode 20BPD is disposed on the second bonding surface of the memory cell array chip 20B. The CMOS chip 10 and the memory cell array chips 20A and 20B are produced in separate wafers, are adhered (bonded) to the pad electrode 10APD and the pad electrode 20PD1, and are adhered (bonded) to the pad electrode 20BPD and the pad electrode 20PD2 by CBA technique.

Various configurations are possible for the bonded structure of the semiconductor device according to the embodiment. For example, a bonded structure between silicon wafers, a bonded structure between a silicon wafer and an insulating layer, and the like may be used. In addition, the bonded structure may be a multilayer structure having two or more layers. An insulating film layer or a ceramic substrate may be used as the insulating layer. In addition, the wafer is not limited to a silicon wafer, and a SiC wafer, a GaN wafer, or the like may be used.

(Specific Example)

A specific example of the first structural example illustrated in FIG. 12 will be described below. The semiconductor storage device according to the embodiment may have a wiring shape in which the devices to be bonded to each other are connected to each other via pad electrodes.

In the above description, the devices are, for example, the first circuit chip and the second circuit chip. The first circuit chip and the second circuit chip are formed on separate wafers. The first circuit chip and the second circuit chip are bonded to each other in a flip chip.

The first circuit chip is, for example, a CMOS chip. The second circuit chip is, for example, a memory cell array chip. Hereinafter, the CMOS chip and the three-dimensional (3D) memory cell array chip will be specifically described as an example.

Figure 17A:
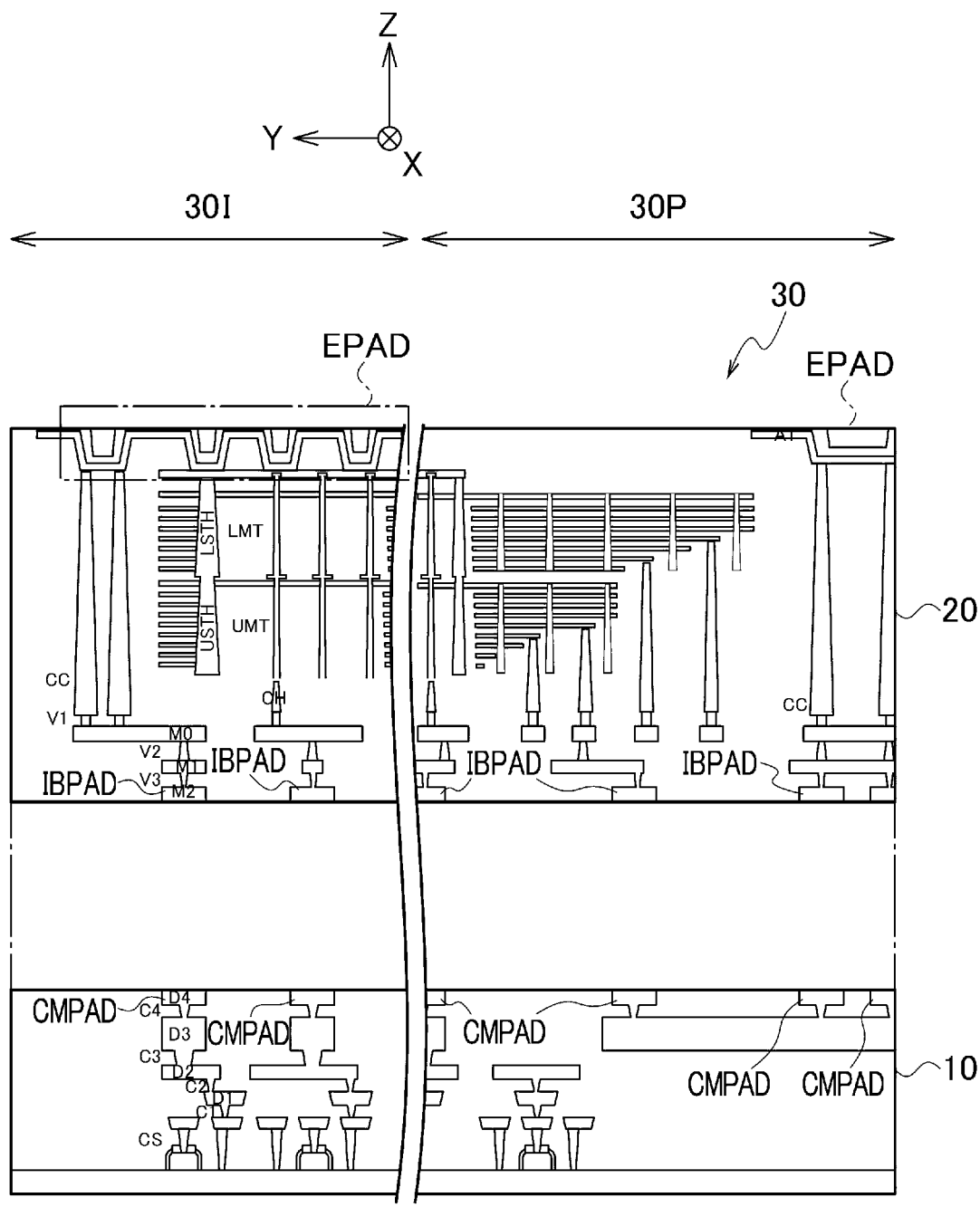
FIG. 17A is a cross-sectional view of the semiconductor device according to the embodiment before bonding.
Figure 17B:
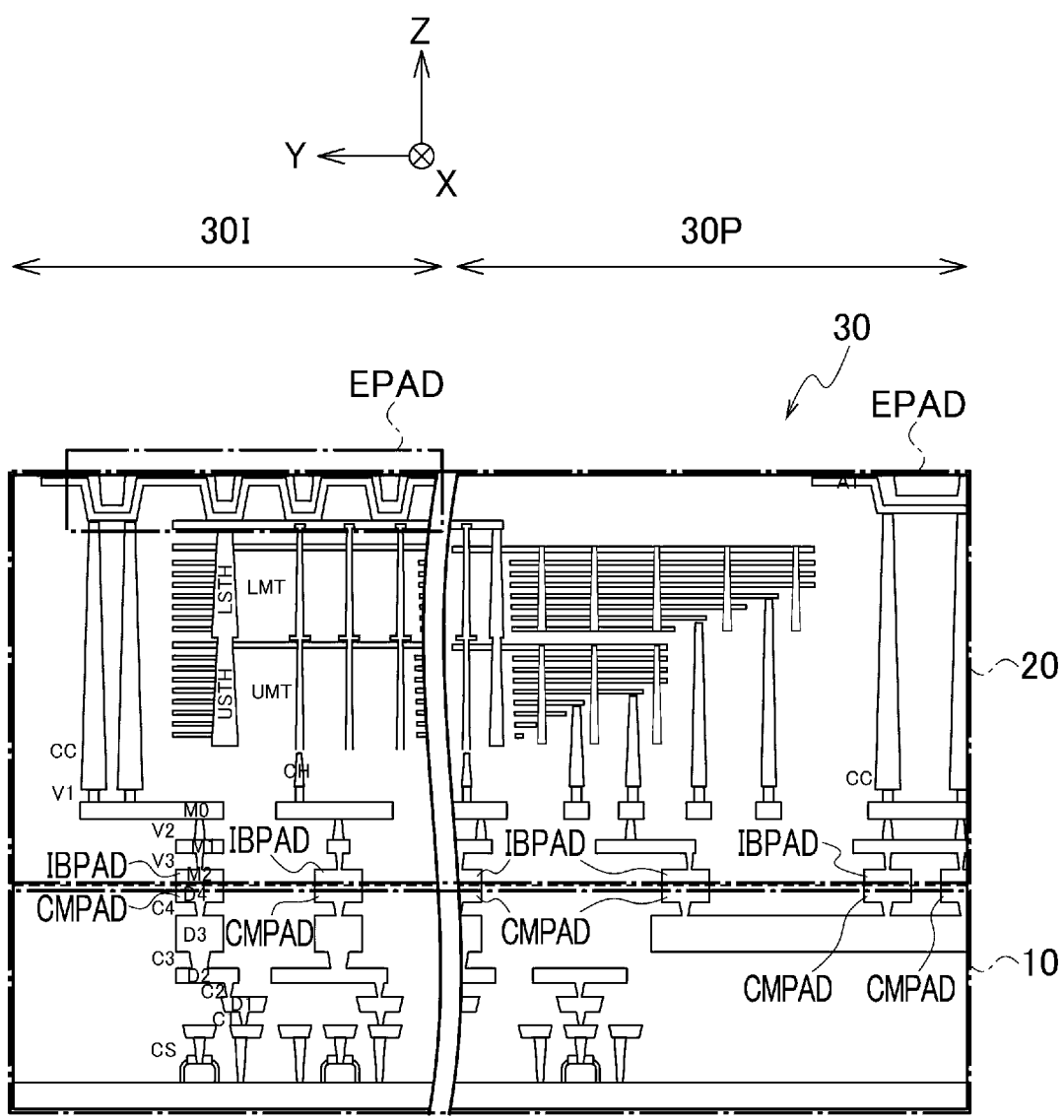
FIG. 17B is a cross-sectional view of the semiconductor device according to the embodiment after bonding.

FIG. 17A is a cross-sectional view of the semiconductor storage device 30 according to the embodiment before bonding. In addition, FIG. 17B is a cross-sectional view of the semiconductor storage device 30 according to the embodiment after bonding.

The memory cell array 20 is provided in the flip chip on the CMOS chip 10. The plane parallel to the bonding surface of the CMOS chip 10 is defined as an X-Y plane, and the direction perpendicular to the X-Y plane is defined as a Z direction. In addition, an X direction and a Y direction are orthogonal to each other.

The semiconductor storage device 30 includes the CMOS chip 10 and the memory cell array chip 20. The CMOS chip 10 and the memory cell array chip 20 are bonded to each other. A pad electrode CMPAD of the CMOS chip 10 is disposed in the bonding portion of the CMOS chip 10. A bonding pad electrode IBPAD of the memory cell array chip 20 is disposed in the bonding portion of the memory cell array chip 20. The pad electrode CMPAD and the bonding pad electrode IBPAD are connected to each other.

The bonding pad electrode IBPAD is a pad electrode for connecting the pad electrode CMPAD of the CMOS chip 10. The pad electrode CMPAD is a pad electrode for supplying power to the CMOS chip 10 or a pad electrode for supplying signals. In addition, a pad electrode EPAD is disposed on the surface of the semiconductor storage device 30. The pad electrode EPAD is a pad electrode for supplying power to the CMOS chip 10 or the memory cell array chip 20 from the outside or a pad electrode for supplying signals.

The memory cell array chip 20 includes a 3D NAND flash memory cell array configuration. The memory cell array chip 20 includes a main area 30I and a peripheral area 30P. In the main area 30I, an upper layer memory cell group (UMT) and a lower layer memory cell group (LMT) having a 3D configuration are stacked. The peripheral area 30P has a staircase structure in which electrodes can be easily taken out from the word line. The memory cell array chip 20 has a two-tier configuration (2-tier) including an upper tier (USTH) and a lower tier (LSTH). The memory cell array structure of the memory cell array chip 20 will be described later with reference to FIG. 20.

(Configuration of Semiconductor Storage Device)

FIG. 18 is a block diagram of the semiconductor storage device 30 according to the embodiment.

The semiconductor storage device 30 includes a memory cell array 20, an input/output circuit 22, a logic control circuit 23, a register 24, a sequencer 25, a voltage generation circuit 26, a driver set 27, a row decoder 28, and a sense amplifier module 29. Herein, the memory cell array 20 corresponds to the memory cell array chip 20. Other configurations correspond to the CMOS chip 10.

In the manufacturing technique of the semiconductor storage device 30, the manufacturing apparatus 1 according to the embodiment illustrated in FIG. 1 may be employed. That is, in some manufacturing processes in which a bonded wafer of the CMOS chip 10 and the memory cell array chip 20 is used as the work 8, a process of peeling the bonded wafer of the work 8 or a process of re-bonding after inspection may be used.

The memory cell array 20 includes a plurality of blocks BLK (BLK0, BLK1, . . . ). The block BLK includes a plurality of nonvolatile memory cell transistors associated with word lines and bit lines. The block BLK may be, for example, a unit of data erasing, and thus, the data in the same block BLK are collectively erased. Each block BLK includes a plurality of string units SU (SU0, SU1, SU2, . . . ). Each of the string units SU is a set of the NAND strings NS. The NAND string NS includes a plurality of memory cell transistors. Hereinafter, the memory cell transistor is also simply referred to as a "cell". It is noted that the number of blocks in the memory cell array 20, the number of string units in one block BLK, and the number of NAND strings in one string unit SU may be set to any number.

The input/output circuit 22 transmits and receives a signal I/O<7:0> to and from an external controller. The input/output circuit 22 transfers a command CMD and an address ADD in the signal I/O<7:0> to the register 24. The input/output circuit 22 transmits and receives write data and read data to and from the sense amplifier module 29.

The logic control circuit 23 receives signals/CE, CLE, ALE, /WE, /RE, and /WP from an external controller. In addition, the logic control circuit 23 transfers a signal /RB to an external controller to notify the outside of the state of the semiconductor storage device 30.

The register 24 stores the command CMD and the address ADD. The register 24 transfers the address ADD to the row decoder 28 and the sense amplifier module 29 and transfers the command CMD to the sequencer 25. The sequencer 25 receives the command CMD and controls the entire semiconductor storage device 30 according to the sequence based on the received command CMD.

The voltage generation circuit 26 generates a voltage necessary for operations such as writing, reading, and erasing data based on an instruction from the sequencer 25. The voltage generation circuit 26 supplies the generated voltage to the driver set 27.

The driver set 27 includes a plurality of drivers and supplies various voltages from the voltage generation circuit 26 to the row decoder 28 and the sense amplifier module 29 based on the addresses from the register 24. The driver set 27 supplies various voltages to the row decoder 28, for example, based on the row address in the address.

The row decoder 28 receives the row address in the address ADD from the register 24 and selects a block BLK or the like based on the block address in the row address. The voltage from the driver set 27 is transferred to the selected block BLK via the row decoder 28.

During the reading data, the sense amplifier module 29 senses the read data read from the memory cell transistor into the bit line and transfers the sensed read data to the input/output circuit 22. During the writing data, the sense amplifier module 29 transfers the write data written via the bit line to the memory cell transistor. In addition, the sense amplifier module 29 receives a column address in the address ADD from the register 24 and outputs a column data based on the column address.

(Example of Circuit Configuration of Memory Cell Array)

Figure 19:
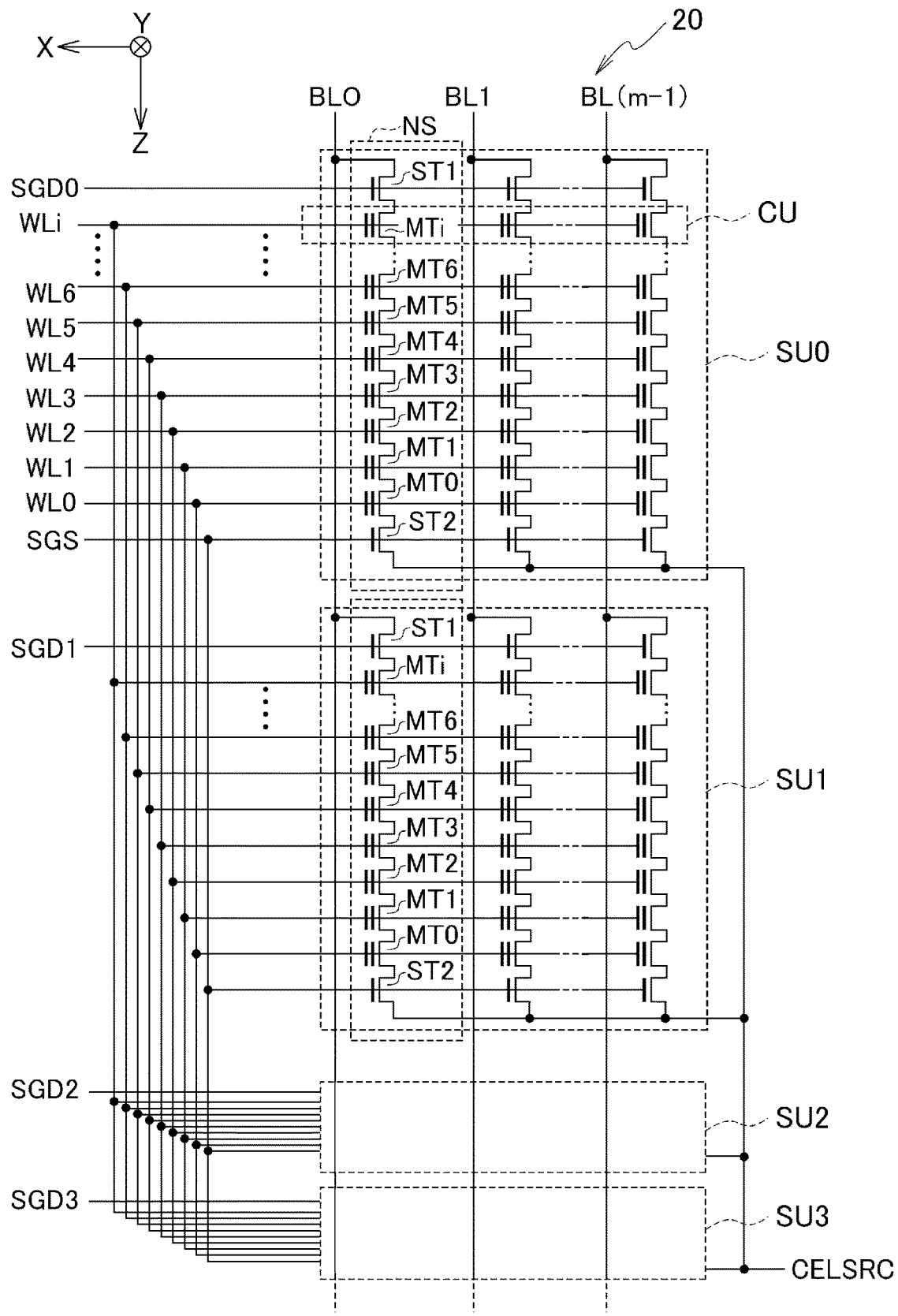
FIG. 19 is a diagram illustrating an example of a circuit configuration of a memory cell array of the semiconductor device according to the embodiment.

FIG. 19 is a diagram illustrating an example of a circuit configuration of the memory cell array 20 of the semiconductor storage device 30 according to the embodiment. As illustrated in FIG. 19, each of the NAND strings NS includes, for example, i (i is a natural number) memory cell transistors MT (MT0 to MTi), select transistors ST1, and select transistors ST2. It is noted that the number i of the memory cell transistors MT may be, for example, 8, 16, 32, 64, 96, 128, or the like, and the number is not limited. In addition, the i (i is a natural number) memory cell transistors MT (MT0 to MTi) may have a two-tier configuration (2-tier). In the two-tier configuration, the memory cell transistors MT (MT0 to MTi) are arranged in the configurations of, for example, MT0 to MT(i/2−1) and MT (i/2) to MTi.

The memory cell transistor MT includes a stacked gate structure including a control gate and a charge storage layer. In addition, the memory cell transistor MT may have a stacked gate structure including a control gate and a floating gate. Each of the memory cell transistors MT is connected in series between the select transistors ST1 and ST2.

In a certain block BLK, the gates of the select transistors ST1 of the string units SU0 to SU3 are connected to select gate lines SGD0 to SGD3, respectively. In addition, the gates of the select transistors ST2 of all the string units SU in the block BLK are commonly connected to a select gate line SGS. The control gates of the memory cell transistors MT0 to MTi in the same block BLK are connected to word lines WL0 to WLi, respectively. That is, the word line WL of the same address is commonly connected to all the string units SU in the same block BLK, and the select gate line SGS is commonly connected to all the string units SU in the same block BLK. On the other hand, the select gate line SGD is connected to only one of the string units SU in the same block BLK.

In addition, among the NAND strings NS arranged in a matrix configuration in the memory cell array 20, the other end of the select transistor ST1 of the NAND strings NS in the same line is connected to any of m bit lines BL (BL0 to BL (m−1) (m is a natural number)). In addition, a bit line BL is commonly connected to the NAND strings NS in the same row over the plurality of blocks BLK.

In addition, the other end of the select transistor ST2 is connected to the source line CELSRC. The source line CELSRC is commonly connected to the plurality of NAND strings NS over the plurality of blocks BLK.

The data is erased collectively for the memory cell transistors MT in the same block BLK. On the other hand, data reading and writing are collectively performed for the plurality of memory cell transistors MT commonly connected to any of the word lines WL in any of the string units SU of any of the blocks BLK. A set of the memory cell transistors MT sharing a word line WL in one string unit SU is referred to as a cell unit CU. The cell unit CU is the set of memory cell transistors MT that can be collectively written or read.

It is noted that one memory cell transistor MT can store, for example, a plurality of bit data. In the same cell unit CU, a set of 1 bit stored by each of the memory cell transistors MT in the same bit is called a "page". The "page" is defined as a memory space formed in a set of memory cell transistors MT in the same cell unit CU.

(Example of Cross-Sectional Structure of Memory Cell Array)

FIG. 20 illustrates an example of a cross-sectional structure of the memory cell array 20 of the semiconductor storage device 30 according to the embodiment. The cross-sectional structure of the memory cell array 20 will be described with reference to FIG. 20. The memory cell array 20 is provided on the flip chip on the CMOS chip 10 as described in the semiconductor device 30 according to the embodiment. The plane parallel to the bonding surface of the CMOS chip 10 is defined as the X-Y plane, and the direction perpendicular to the X-Y plane is defined as the Z direction. In addition, the X direction and the Y direction are orthogonal to each other.

FIG. 20 is a cross-sectional view of a source line contact LI and the NAND strings of the string units SU0 and SU1 cut in the direction (the X direction parallel to the semiconductor substrate 100) perpendicular to the Y direction in which the word line WL extends. It is noted that, in the example of FIG. 20, in order to simplify the description, a case where the plurality of NAND strings NS are arranged in one row along the Y direction in one string unit SU is illustrated, but the arrangement of the NAND strings NS in the one string unit SU may be set to be any arrangement. For example, the NAND strings NS may be arranged in two rows in parallel along the Y direction or may be arranged in a staggered arrangement in four rows.

As illustrated in FIG. 20, an insulating layer 118 is provided on the side surface of the source line contact LI. One string unit SU is disposed between the two source line contact LIs with the insulating layer 118 interposed so that the source line contact LI and wiring layers 111, 112, and 113 are not electrically connected.

In each string unit SU, the NAND string NS is formed along the Z direction perpendicular to the semiconductor substrate 100. More specifically, the surface region of the semiconductor substrate 100 is provided with an n-type well region 101, and the surface region of the n-type well region 101 is further provided with a p-type well region 102. In addition, an n$^+$-type impurity diffusion region 103 is provided on the surface region of the p-type well region 102. Insulating layers 110 are provided on the semiconductor substrate 100, and a wiring layer 111 functioning as a select gate line SGS, a 96-layer wiring layer 112 functioning as word lines WL0 to WL95, and a wiring layer 113 functioning as a select gate line SGD are sequentially stacked on the upper layer. Then, the insulating layer 110 is provided between the wiring layers 111, 112, and 113, respectively. For example, a silicon oxide film is used for the insulating layer 110. It is noted that, a plurality of wiring layers 111 and 113 may be provided.

A memory pillar MP penetrating the wiring layers 111, 112, and 113, and the plurality of insulating layers 110 to reach the p-type well region 102 is provided corresponding to one NAND string NS. More specifically, the NAND string NS has the two memory pillars MP stacked along the Z direction. More specifically, the memory pillar MP1 penetrating the wiring layer 111 corresponding to the select gate line SGS, the wiring layer 112 corresponding to the word lines WL0 to WL47, and the plurality of insulating layers 110 and being connected to the semiconductor substrate 100 is provided. Then, the memory pillar MP2 penetrating the wiring layer 112 corresponding to word lines WL48 to WL95, the wiring layer 113 corresponding to the select gate line SGD, and the plurality of insulating layers 110 and being connected to the upper surface of the memory pillar MP1 is provided along the Z direction.

In the example of FIG. 20, the diameters of the upper surfaces (openings) of the memory pillars MP1 and MP2 is larger than the diameters of the bottom surfaces. The side surface of the pillar has an inclination angle of 90 degrees or less with respect to the plane of the semiconductor substrate 100 (hereinafter, such a shape is referred to as a "tapered shape"). It is noted that the shape of the memory pillar MP is not limited to the tapered shape. For example, the memory pillar MP may have a cylindrical shape having the same diameter from the upper surface to the bottom surface or may have a shape in which the diameter of the bottom surface is larger than the diameter of the upper surface. The structure in which the two memory pillars MP are stacked (two-tier configuration (2-tier)) has been described. Alternatively, a structure in which one or three or more memory pillars MP are stacked may be used. Hereinafter, when the memory pillars MP1 and MP2 are not limited, the memory pillars MP1 and MP2 are simply referred to as "memory pillar MP".

A block insulating layer 116, a charge storage layer 115, and a tunnel insulating layer 114 are stacked in this order on the side surface of the memory pillar MP, and the inside of the memory pillar MP is buried with the semiconductor layer 117. For example, a silicon oxide film is used for the block insulating layer 116 and the tunnel insulating layer 114. For example, a silicon nitride film is used for the charge storage layer 115. For example, polycrystalline silicon is used for the semiconductor layer 117. The semiconductor layer 117 in the memory hole MH is a region in which a channel is formed when the memory cell transistor MT and the select transistors ST1 and ST2 are turned on.

The memory cell transistors MT0 to MT95 are formed by the memory pillar MP and the word lines WL0 to WL95 (wiring layer 112). Similarly, the select transistors ST1 and ST2 are formed by the memory pillar MP and the select gate lines SGD (wiring layer 113) and the SGS (wiring layer 111). The upper surface of the memory pillar MP (MP2) is connected to the bit line BL (not illustrated). In the present embodiment, the word lines WL0 to WL47 are defined as a lower tier WL group, and a group of the word lines WL48 to WL95 is defined as an upper tier WL group.

In addition, the source line contact LI has a line shape along the Z direction. For example, polycrystalline silicon is used for the source line contact LI. The bottom surface of the source line contact LI is connected to the n⁺ type impurity diffusion region 103, and the upper surface is connected to the source line SL (not illustrated). In addition, the insulating layer 118 is provided on the side surface of the source line contact LI so that the source line contact LI and the wiring layers 111, 112, and 113 are not electrically connected. For example, a silicon oxide film is used for the insulating layer 118.

In the memory cell array 20 of the semiconductor device 30 according to the embodiment, the memory pillar MP may have a cylindrical shape having the same diameter from the upper surface to the bottom surface. That is, the memory pillar MP may have one tier structure.

In the above-described examples of the cross-sectional structure of the 3D memory cell array, an example in which the select gate transistors ST1 and ST2 are disposed at both ends of the NAND string NS has been described. A back gate (BG) method in which the select gate transistors ST1 and ST2 are disposed on one side of the NAND string NS with the configuration of the NAND string NS as a U-shaped structure may also be employed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. An operation method of a manufacturing apparatus, comprising:
   mounting a work in a hot bath, wherein the work includes an upper wafer and a lower wafer at least partially bonded to each other;
   pressing at least respective outer peripheral portions of the upper wafer and the lower wafer to each other, using an upper arm;
   heating a liquid in the hot bath to a boiling point or higher for a specified time, thereby vaporing the liquid present between the upper wafer and the lower wafer to expand a gap between the upper wafer and the lower wafer;
   removing the upper arm from the work; and
   collecting the work.

2. The method according to claim 1, wherein the liquid has a boiling point equal to or lower than a temperature at which the upper and lower wafers are bonded.

3. The method according to claim 1, wherein the liquid includes water or liquid nitrogen.

4. A method for manufacturing a semiconductor device, comprising:
   (i) forming a semiconductor device by bonding an upper wafer to a lower wafer;
   (ii) inspecting the semiconductor device;
   (iii) peeling off the upper wafer from the lower wafer when the inspecting indicates that the semiconductor device is abnormal; and
   (iv) repeating the steps (i) to (iii) until the inspecting indicates a normal semiconductor device,
   wherein the step (iii) further comprises:
      mounting the semiconductor device in a hot bath;
      pressing at least respective outer peripheral portions of the upper wafer and the lower wafer to each other via an upper arm;
      heating a liquid in the hot bath to a boiling point or higher for a specified time;
      removing the upper arm from the semiconductor device; and
      collecting the semiconductor device.

5. The method according to claim 4, wherein the liquid has a boiling point equal to or lower than a temperature at which the upper and lower wafers are bonded.

6. The method according to claim 4, wherein the liquid includes water or liquid nitrogen.

7. The method according to claim 4, wherein the step of heating a liquid in the hot bath to a boiling point or higher comprises vaporizing the liquid in a gap between upper and lower wafers.

8. The method according to claim 1, further comprising discharging the liquid prior to collecting the work.

9. The method according to claim 8, wherein the collected work includes the upper wafer and lower wafer that are peeled off from each other.

10. The method according to claim 4, further comprising discharging the liquid prior to collecting the semiconductor device.

11. The method according to claim 10, wherein the collected semiconductor device includes the upper wafer and lower wafer that are peeled off from each other.

* * * * *